United States Patent [19]

van der Have

[11] Patent Number: 5,008,723
[45] Date of Patent: Apr. 16, 1991

[54] MOS THIN FILM TRANSISTOR

[75] Inventor: Leonard A. van der Have, Ames, Iowa

[73] Assignee: Kopin Corporation, Taunton, Mass.

[21] Appl. No.: 458,590

[22] Filed: Dec. 29, 1989

[51] Int. Cl.⁵ .................... H01L 29/78; H01L 49/02; H01L 27/13
[52] U.S. Cl. ................. 357/23.7; 357/23.1; 357/23.11; 357/49
[58] Field of Search ..................... 357/23.7, 23.11, 49, 357/23.1

[56] References Cited
FOREIGN PATENT DOCUMENTS
63-278273 11/1988 Japan .................................. 357/23.7

OTHER PUBLICATIONS
*IEDM*, 1987, "Novel Selective in Processing", Mieno et al, pp. 16-19, Dec. 198, Wash., D.C.

Primary Examiner—Jerome Jackson, Jr.
Attorney, Agent, or Firm—Hamilton, Brook, Smith & Reynolds

[57] ABSTRACT

Reduction of parasitic coupling capacitances which are otherwise formed between conventional NMOS transistor N type drain regions and the transistor's substrate and well regions is described by using a semiconductor-on-insulator (SOI) substrate and forming the NMOS transistor on a semiconductor (Si) substrate having a buried insulator forming a deep, lightly doped N type subsurface region beneath the conventional surface drain region (but not the source region) which contacts the buried insulator.

12 Claims, 6 Drawing Sheets

MOS THIN FILM TRANSISTOR

FIELD OF THE INVENTION

This invention relates to a method for fabricating microelectronic circuits and in particular metal-oxide-semiconductor (MOS) transistor circuits

BACKGROUND OF THE INVENTION

An MOS transistor which combines selected features of prior art MOS devices made on bulk silicon is illustrated in the prior art drawings of FIGS. 1-6. It should be noted that no such device probably exists in all the details shown in these drawings. Instead, the surface geometry has been made as close as possible to the preferred embodiments of the present invention, in order to emphasize the similarities and dissimilarities between the "prior art" structure and the present invention.

The transistor is an NMOS type transistor and consists of an N-doped or P-doped silicon single crystal bulk substrate 12, which is part of a wafer 15 (only a portion of which is shown) and upon which a thin P-doped epitaxial film 9 is deposited by well-known techniques such as chemical vapor deposition (CVD).

Islands of device regions are formed in the film 9 by converting the volume around the device regions into thick regions of what is called field oxide 4.

The epitaxial film 9 is commonly grown to be the same type as is the choice for the base wafer 12 and then is converted to P-type (if necessary) for the P-well (or body) as required to operate the NMOS transistor. The transistor is formed by a source region 2 a drain region 1 a polysilicon gate 3, polysilicon oxide spacers 5a thin gate oxide 5, a polysilicon interconnect to the drain 6 a silicide strap 7 for contacting the drain to its polysilicon interconnect 6 and body contact opening 8 to body 9. Thick field oxide regions 4 are shown as the result of a trench and refill process in FIGS. 1-5, while FIG. 6 shows the corresponding cross-section of the conventional NMOS drain (taken along V—V of FIG. 2) if made with a conventional LOCOS process Note that in FIG. 6, the interface wall 100 of the field oxide 40 is tapered. FIG. 3 is cross section III—III illustrating the inclusion of lightly doped region 13 around each of the source and drain regions as this is a common practice with contemporary manufacturing techniques for NMOS transistors.

The thick field oxides 4 enable conductive interconnect pathways (not shown) on the surface of the wafer to pass from one MOS transistor to another on the wafer without causing surface inversion in the wafer's silicon-to-oxide interface. Should this field oxide not be amply thick charge inversion in the silicon surface directly below these interconnect pathways will occur which result in the creation of undesired MOS transistor conducting channels which pass electrical currents between pairs of MOS transistors as a function of the voltage difference applied between the interconnect pathways and the silicon surface regions.

Present-day fabrication methods commonly use a field oxide for separating transistors. The field oxide has a thickness greater than the minimum thickness at which the maximum applied integrated circuit operating voltage difference will not cause charge inversion in the silicon surface below any pathway interconnecting transistors. The basis for this determination are well understood by those skilled in the art, and are dependent on silicon surface doping concentrations and of course, electric field strengths in the surface oxides which are directly proportional to applied voltage and inversely proportional to field oxide thickness.

In addition to field oxides conventional MOS transistors also require a thin oxide gate layer 5 to separate the polysilicon gate electrode 3 from the source region 2 and drain region 1 on either side of the gate 3.

In all cases of known process implementations the field oxides are thicker than the oxides 5 used to form the gates of the MOS transistors themselves Of course it is in these gate oxide regions where a conducting "channel" in the silicon surface is desired This difference in oxide thicknesses thereby enables the circuit designer to precisely determine the physical location of each MOS transistor's conducting channel while permitting the interconnection of a plurality of transistors together over field oxides without creating a network of undesired conducting channels which are function of the final transistor-to-transistor layout. As a result designers are able to utilize design automation systems to fully predict the performance of a proposed design before the chip layout is done which greatly simplifies the design process for circuits requiring more than 100 transistors.

Two advanced methods for forming thick field oxides are employed: local oxidation of silicon or LOCOS or the formation of oxide-filled trench regions between transistors. LOCOS is more commonly employed. Both methods customarily use a heavy concentration of P type dopant (such as boron) to (a) assist in the rapid formation of thick field oxides, and (b) to electrically stabilize the silicon-to-oxide interface for the purpose of reducing leakage currents of any P-N junctions which meet these interfaces. The use of boron in this manner enables the reduction of separation distances between devices, as well as minimizing leakage currents in P-N junctions. These leakage currents become primary considerations for power dissipation minimization for integrated MOS circuits requiring greater than 100,000 transistors.

It is with these very-large-scale-integrated (VLSI) circuits that either LOCOS or trench-type oxidations are employed to prevent undesired conduction between pairs of transistors. Either of these oxidations use a P type dopant in the process which results in the formation of a heavily-doped P type or P+ layer 10 between the thick field oxide and the epitaxial film 9.

In the case of NMOS transistors, this P type layer 10 creates a P-N junction to the heavily-doped N type regions or N+ commonly used for the NMOS source 2 and drain 1 regions. This N to P junction is required to stabilize a VLSI circuit for low leakage currents and is commonly formed in the prior art methods and defines the dominant coupling capacitance of each N+ source and drain region to the NMOS transistor's P type body region.

SUMMARY OF THE INVENTION

This invention reduces most of the N to P capacitances occurring in conventional transistor formation while permitting the use of standard MOS process fabrication technologies. In accordance with the invention the MOS transistor is formed on a semiconductor on insulator (SOI) substrate.

For convenience the preferred embodiments herein will illustrate the invention with respect to an SOI structure consisting of an epitaxial or large grain silicon film formed on an insulator consisting of silicon oxide formed on a Si wafer. The silicon film is preferably formed by seeded recrystallization of an amorphous or polysilicon Si film formed on the SiO$_2$ resulting in the formation of a buried SiO$_2$ insulator. (See U.S. 4,670,088 and 4,371,421.) However, it is to be understood that other structures and methods for forming buried insulators are contemplated such as silicon-on-sapphire substrates and semiconductor materials such as GaAs or other III-V material on insulator or Ge on insulator are contemplated.

The method includes the formation of a selective lightly doped drain (LDD) region which extends from the conventional N type drain region to an underlying surface of the buried insulator.

This reduces parasitic NMOS drain to substrate capacitance by approximately one order of magnitude. This capacitance reduction improves the electronic speed performance of MOS memories and complex (more than 1000 gates) logic arrays.

This new deep N type drain causes the doping of the silicon regions below and on a minimum of two, or optimally, three of its four sides to become N type where these sides meet these oxides rather than for the N type drain to meet with various P type regions as is the case with conventional NMOS transistors. The N+ drain becomes N type contiguously to the buried insulating oxide, as well as to the sidewall oxides (fabricated by either a LOCOS or a trench filled with oxide) on the two lateral sidewall interfaces which border the N+ drain region. It is optional that this conversion from P to N occur at the end of the N+ drain (a third side opposite the side where the drain faces the active channel).

As a result of the method of the invention, the bottom and two (or three) of the four sidewall P-N junction interfaces of the N-type drain region are replaced with N-type to oxide interfaces. This change results in the elimination of associated P-N junction capacitances and the inclusion of capacitances which are the result of the sidewall and buried oxides to other devices and the substrate wafer region below the buried insulating oxide. These added oxide-related capacitances are between 20 and 200 times lower per unit area than are the capacitances per unit area for the P-N junctions formed in the conventional NMOS transistor drain region. This results in a reduction of the overall capacitance parasitically coupling an NMOS transistor's drain region to other regions in the wafer, producing higher obtainable operating speed, particularly in circuits where a plurality of NMOS drains are electrically connected together; since in conventional NMOS circuits coupling of drains together, such capacitance is additive.

A further important aspect of the present invention is that the new deep lightly doped, N type drain which extends to the buried insulator is selectively formed only in the drain region and no such similar extension is permitted in the source region. This permits the volume under the conventional shallow N type source region to be used as a pathway to electrically connect the transistor body to circuit ground potential, thereby conserving the use of surface real estate, which is so important in integrated circuit design.

BRIEF DESCRIPTION OF THE DRAWINGS

The foregoing and other objects, features, and advantages of the invention will be apparent from the following, more particular, description of preferred embodiments, as illustrated in the accompanying drawings. These drawings use reference characters which refer to similar parts throughout the various views, except that a prime has been added in FIGS. 7–12 to denote the parts which belong to the present invention and not the prior art. The drawings are not necessarily to scale, while emphasis is placed upon illustrating the principles of the invention.

FIGS. 7–11 show these oxides as though they were formed with a trench and refill process, which is the preferred embodiment of this invention.

DETAILED DESCRIPTION OF THE INVENTION

Figure 7:
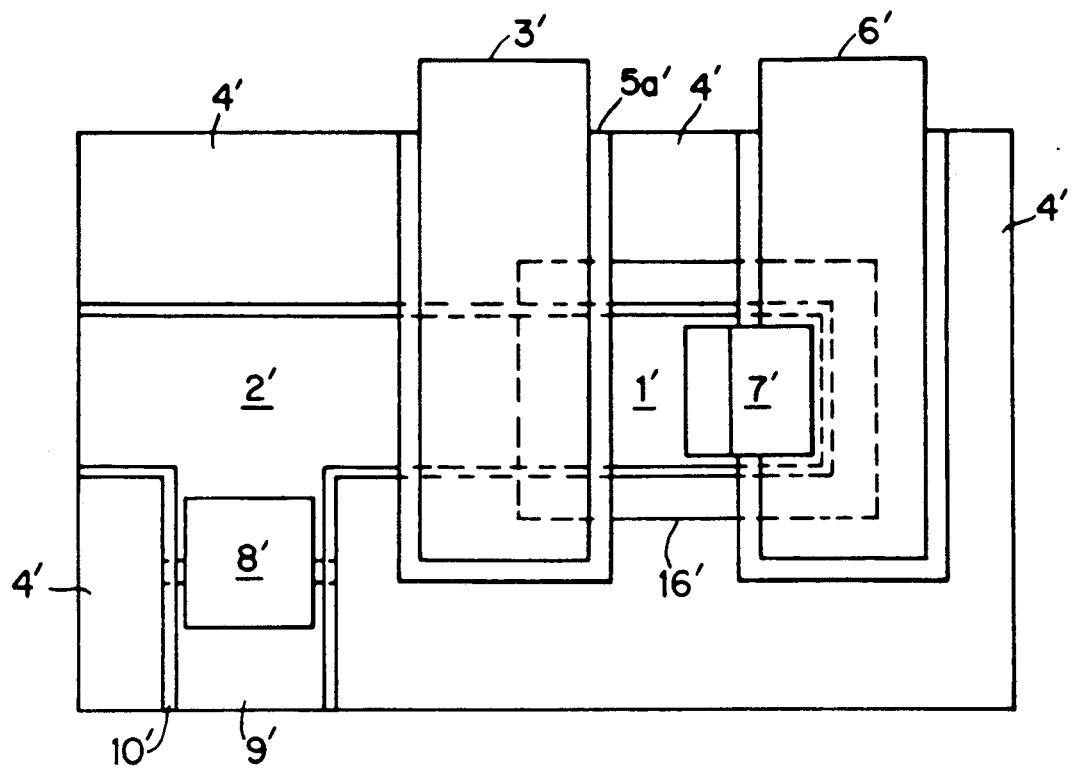
FIG. 7 is a plan view of an NMOS transistor according to the preferred embodiment as seen from the surface of the wafer.

In the preferred embodiment an NMOS transistor is used for illustration, but the invention is useful for PMOS devices as well.

A portion of an integrated circuit wafer 15' wafer is shown in each of FIGS. 7–12 in which one of a plurality of MOS field-effect transistors is formed. An N+ drain region 1' an N+ source region 2', are formed in a monocrystalline epitaxy layer 9'. A polysilicon gate layer 3' is formed on a thin layer of insulating oxide 5' which is formed on top of epitaxial layer 9'. Oxide 5' separates the source and drain regions of the transistor. The gate oxide also includes the formation of oxide spacers 5a' on the sidewalls of the polysilicon layer 3' which serve to reduce capacitance between the gate 3' and each of the drain 1' and source 2' regions. Thick field oxides 4' are formed by a trench and refill process and form an insulating lateral boundary encompassing the various active regions of the NMOS transistor, i.e., regions 1', 2', 9' and 14'. Note that as an alternate to the trench and refill process, a so-called mesa-isolation structure may be employed in which the trench is not filled in. This has the advantage of a reduction in process steps with the attendant disadvantage of loss of surface planarity. However, if the silicon film is sufficiently thin, then the surface planarity loss can be accommodated.

A buried oxide layer 11' is also included to act as a bottom insulating boundary for the various NMOS transistor regions 9' and 14'. This buried oxide layer 11' resides on top of an Si wafer substrate identified as region 12' in FIGS. 7-12. On top of the buried oxide layer 11' is a mono-crystalline Si epitaxy layer 9', which has been lightly doped to be P-type and which forms the P-well (or body) of the NMOS transistor.

Silicide strap 7' of a refractory metal silicide, such as titanium silicide, is used to provide an electrically conductive contact region to pass current from the N+ drain region 1' directly to a polysilicon strip 6', which may optionally be used for gates or electrical interconnect to other devices elsewhere on integrated circuit wafer 15'. Also, silicide contact 8' (FIG. 8) is optionally used to provide for the simultaneous, low-impedance electrical contact of the N+ source region 2' and the P-well (or body) region 9'. These regions may then later be connected to the circuit's ground potential (Vss, usually by way of a metal film not shown here) as required for predictable, stable gain and highest current delivery of the NMOS transistor depicted in each of FIG. 7-12. Note that use of the silicide strap greatly reduces the amount of area required to make ohmic contact to both source and body regions and also reduces the main remaining cause of undesirable parasitic capacitance which would otherwise be present using conventional prior art contact techniques.

Insulating thick field oxides 4', formed by either a trench and refill process, or a local oxidation process, cause the removal of epitaxy 9' and form insulating oxides 4' aided by the use of a P-type implant or diffusion. This implant or diffusion increases the rate of conversion of epitaxy to oxide in regions 4' and results in the formation of a thin P+ layer 10' in the sidewalls of the remaining epitaxy regions 9'. In addition, a thin layer 10a' of P+ is optionally provided in the bottom of the epitaxy regions 9'. The P+ layer 10a' can be formed by using a high energy P type (boron) implant in the SOI wafer, such that the peak in the concentration of implanted boron is nominally set to be at a depth equal to the plane which forms the interface between epitaxy 9 and insulator 11. The implantation is followed by a high temperature anneal or charge activation, which is such that P+ 10a' layer is formed in the bottom of epitaxy 9. Thin layer 10a', together with the P+ sidewall layer 10', creates a beneficial, low-leakage N+ to P+ type of P-N junction at all points where the N+ source and drain regions 1', 2', 13' and 14' meet the oxide regions 4' and 11'. Without the formation of the P+ layers 10' and 10a' then N to P— P-N junctions would be formed at all points where the N+ regions 1', 2', 13' and 14' meet the oxide regions 4' and 11'. This type of N+ to P— junction has been shown to exhibit high leakage current under electrical reverse bias conditions due to charge trapping in the fabrication of sidewall oxide to epitaxy interfaces.

Figure 9:
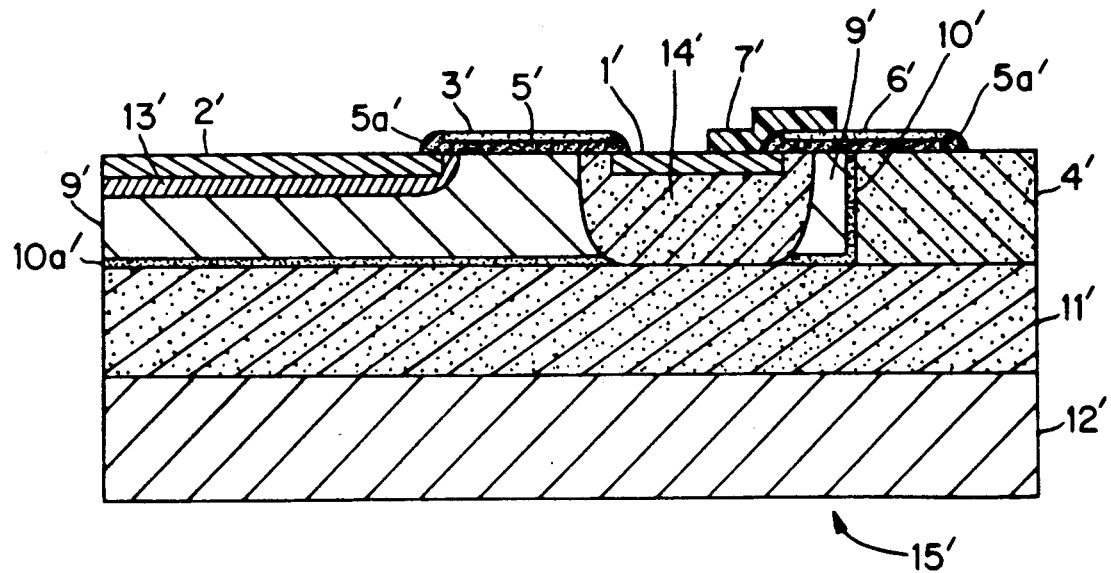
FIG. 9 is a cross-sectional view along lines IX—IX of FIG. 8.
Figure 2:
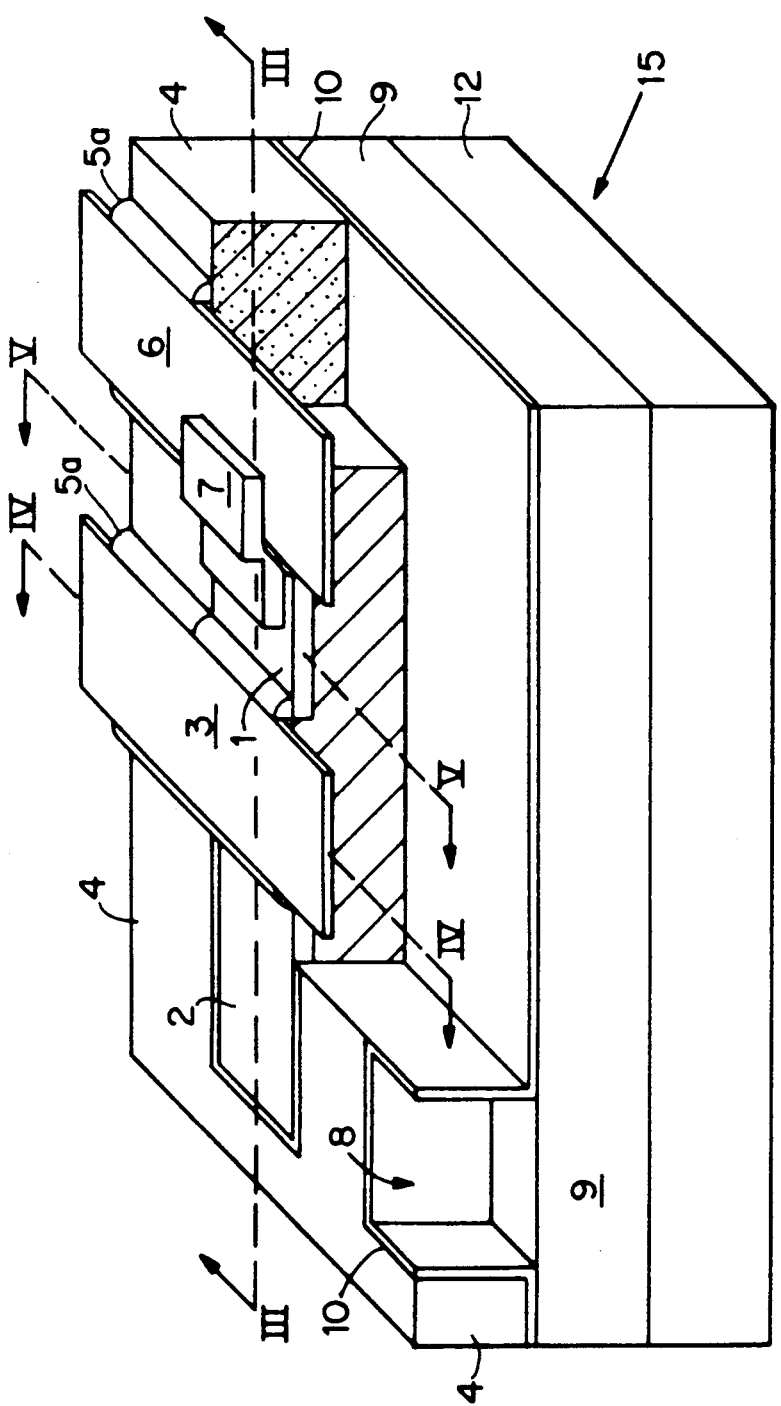
FIG. 2 is a diagonal view of the NMOS transistor shown in FIG. 1, according to the prior art.
Figure 4:
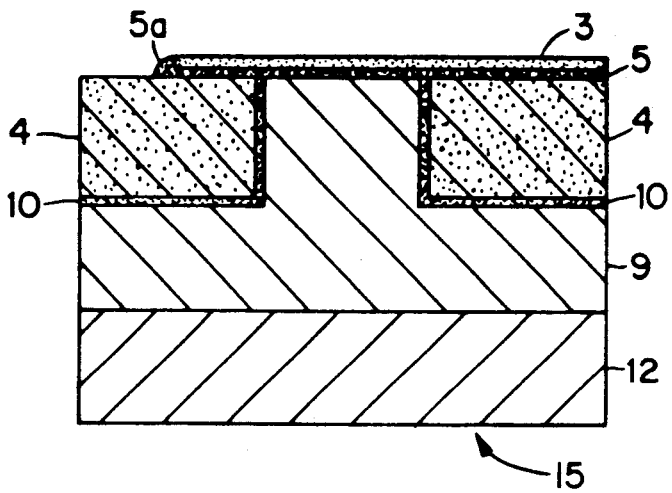
FIG. 4 is a cross-sectional view along lines IV—IV of FIG. 2.
Figure 5:
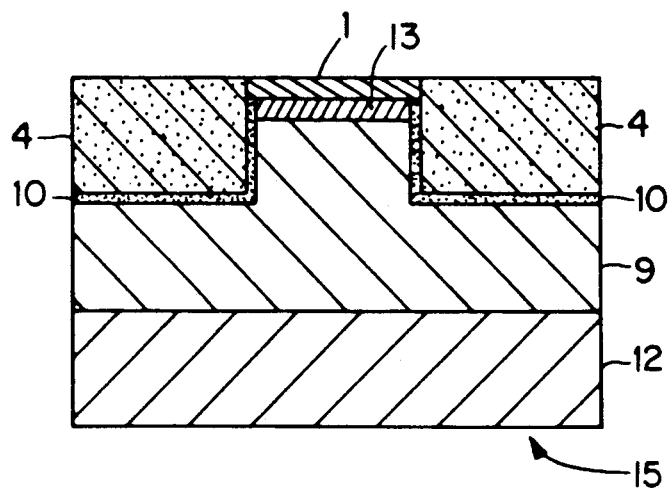
FIG. 5 is a cross-sectional view along lines V—V of FIG. 2.
Figure 6:
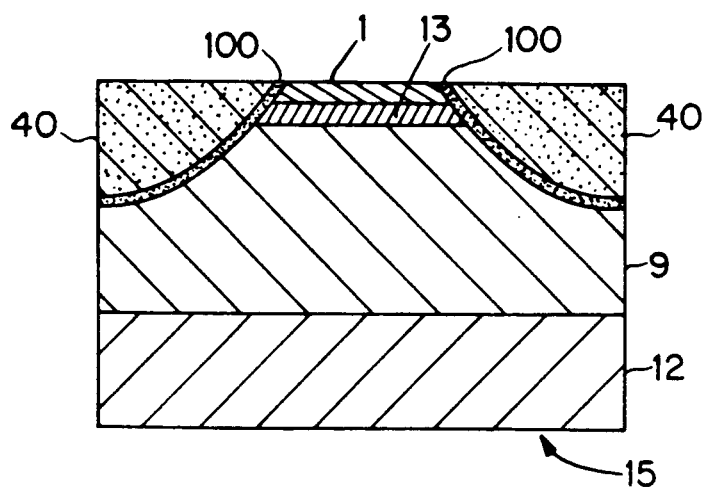
FIG. 6 is a cross-sectional view along lines V—V of FIG. 2 as if it were manufactured using a LOCOS process in accordance with the prior art.
Figure 1:
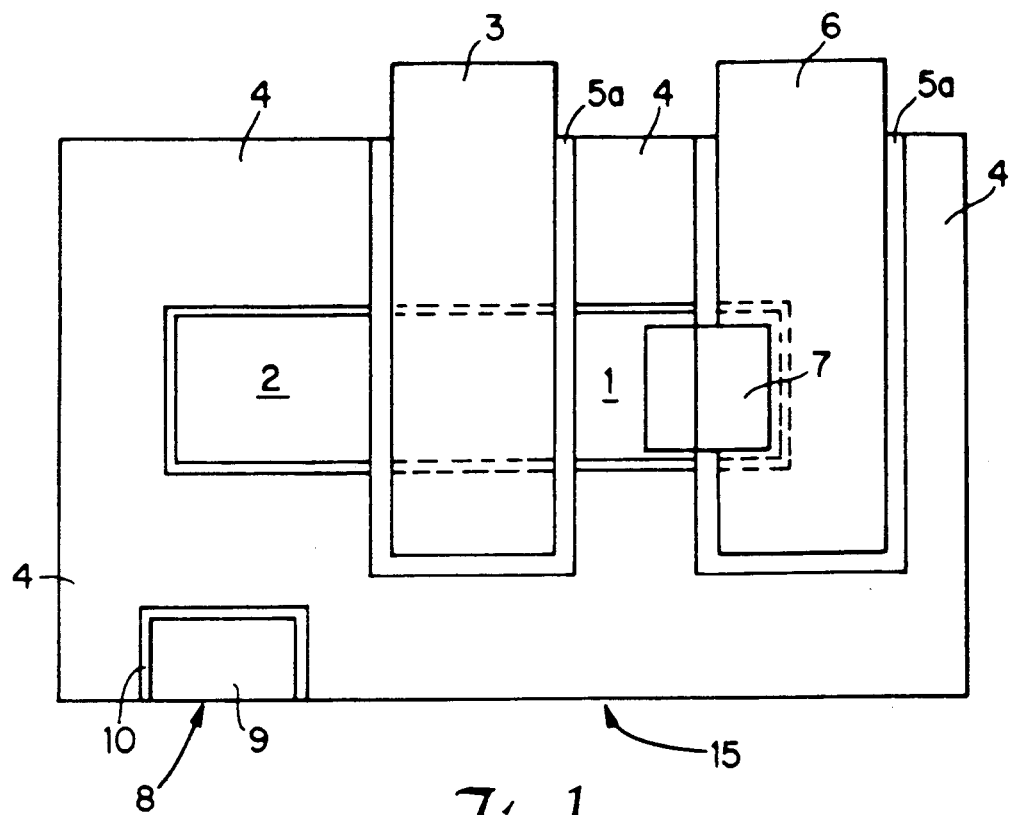
FIG. 1 is a plan view of a conventional prior art NMOS transistor geometry, as seen from the surface of the wafer.
Figure 3:
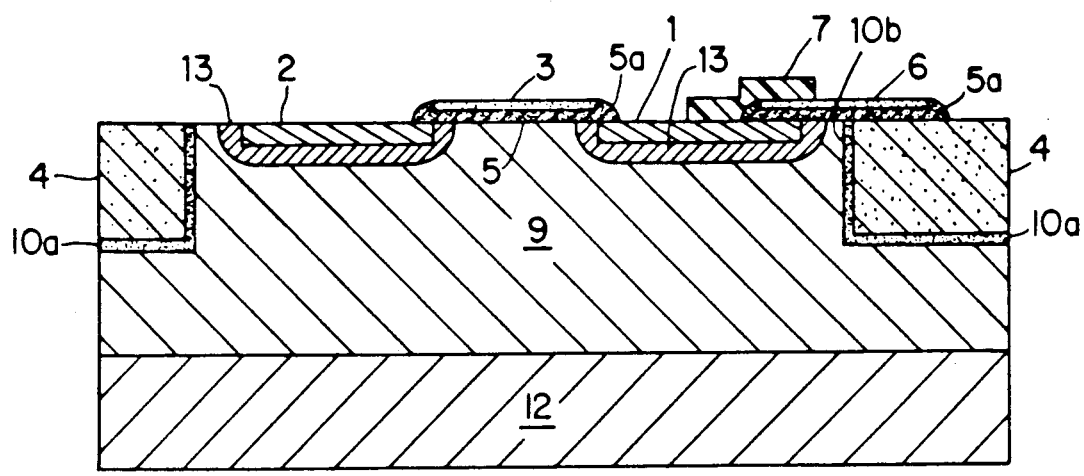
FIG. 3 is a cross-sectional view along lines III—III of FIG. 2.
Figure 8:
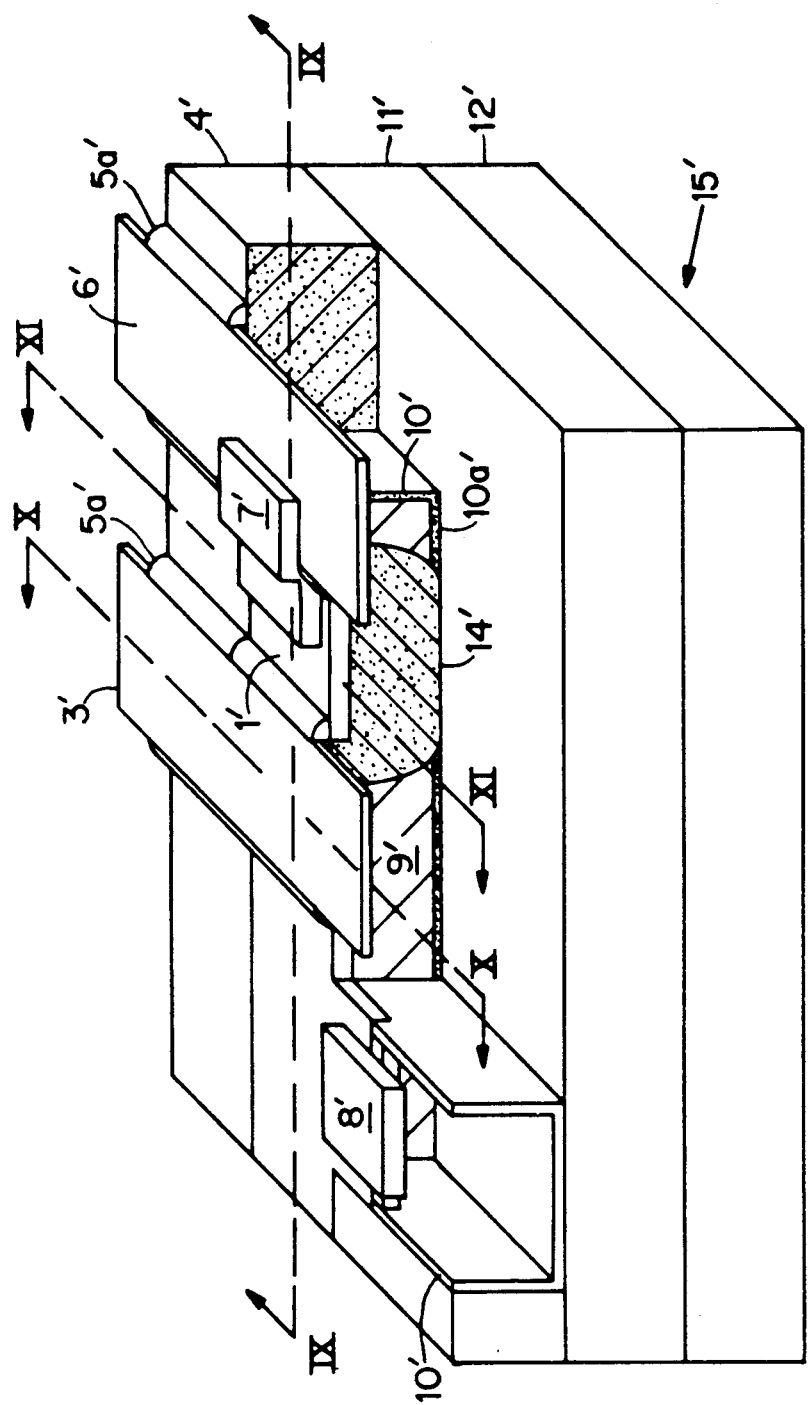
FIG. 8 is a partially exploded diagonal view of the same NMOS transistor shown in FIG. 7 according to the preferred embodiment.
Figure 10:
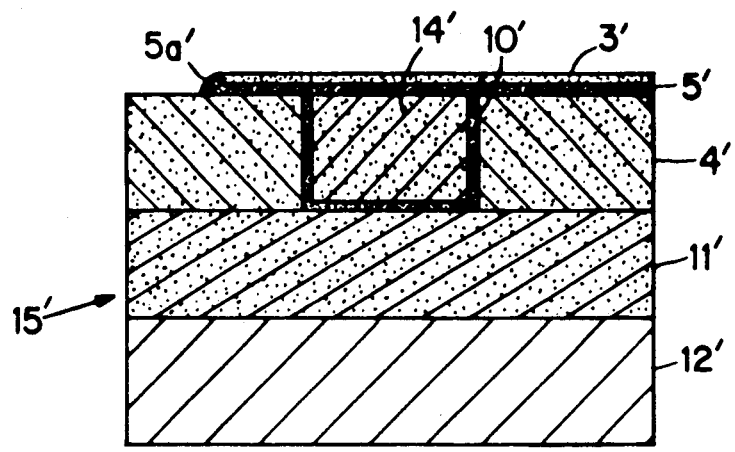
FIG. 10 is a cross-sectional view along lines X—X of FIG. 8.

To prevent the high leakage currents, this new structure of the invention provides for N+ to P+ junctions at a plurality of oxide sidewall interfaces while also minimizing the area of these junctions, which are characterized by a relatively high capacitance per unit area. Region 14' is a deep, lightly doped-drain (LDD), which is implanted or diffused as N+ in the area of the transistor's drain only, as shown in FIG. 7-12. This region is fabricated to be deeper in the epitaxy when compared with the N+ drain 1' or source 2' regions, and is also deeper than other optional standard lightly-doped drain regions, such as depicted by region 13' encompassing the source region 2' and, in fact, extends to insulator 11' below. This selective, deep LDD is designed to cause complete conversion of epitaxy region 9' and the P+ layer 10' in the sidewalls and P+ layer 10a' in the bottom of epitaxy 9' to become N+, which then meets the oxides in regions 4' and 11'. Region 16' is a mask feature, which is processed after the polysilicon gate 3' is fabricated, so that the polysilicon gate 3' also acts as a mask boundary to the formation of region 14', as shown in FIGS. 9 and 8. In this manner self-alignment of the LDD region 14' with the channel is achieved.

Figure 11:
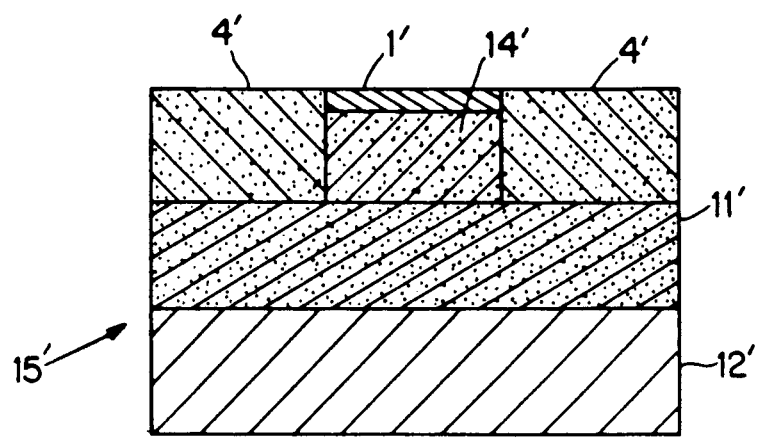
FIG. 11 is a cross-sectional view along lines XI—XI of FIG. 8.
Figure 12:
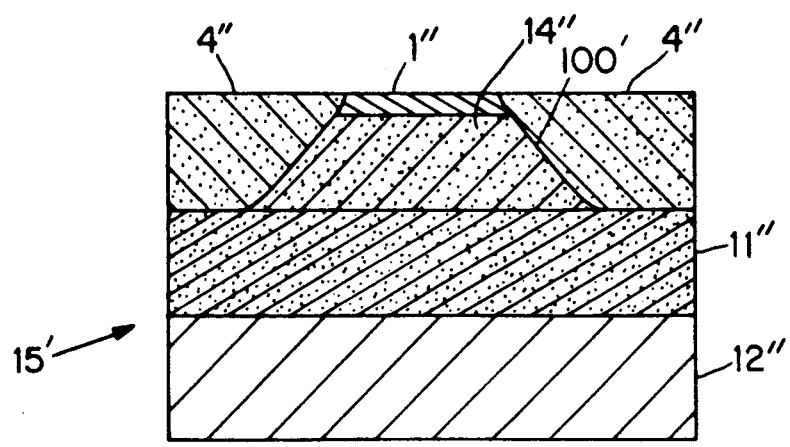
FIG. 12 is a cross-sectional view along lines XI—XI of FIG. 8 as if it were manufactured using a LOCOS process to fabricate the thick field (or "sidewall") oxides.

FIG. 12 illustrates the changes in the sidewalls of oxide regions 4' as a result of using a conventional LOCOS process, as compared to the preferred embodiment illustrated by FIG. 11. Each of these figures show the cross-section of the NMOS transistor's drain region along lines XI—XI of FIG. 8. Oxides formed by a trench and refill process (FIG. 11), for example, result in a straight and perpendicular sidewalls to regions 4', while the LOCOS process (FIG. 12) results in sloping or angled sidewalls 100' to the thick field oxides 4''. The disadvantage in using a LOCOS process over the preferred embodiment is the requirement for a larger area required to accommodate the field oxides. These oxides are fabricated to a depth such that (regions 4' meet with the top of the buried oxide layer 11', as required to form a complete oxide perimeter around completely N type regions 1' and 14' (See FIGS. 11 and 12) along the cross-section XI—XI of FIG. 8.

It is important to note that the body region directly under the gate 3' of the NMOS transistor remains in ohmic contact with the circuit ground potential made at the silicide contact 8'. This is due to the fact that by the organization of this NMOS transistor structure, the P type well (or body) region 9' is contiguous from the channel region under gate 3' to contact 8'. This organization insures that the body region under the gate 3' remains at ground potential at all times. This would not be possible if the source 2' were to be modified by a deep LDD 14', as is the drain 1'. Therefore, it is necessary that the deep LDD 14' be selectively patterned over drain 1' only, so that the body can be connected to ground by a pathway that uses the area under the source in the epitaxy 9'. Therefore no area penalty results from this organization as is commonly the case with conventional NMOS device designs.

It is also important to note that the organization of the NMOS transistor, according to the preferred embodiment in FIGS. 7-12, does not utilize the more conventional method used in bulk Si structure for making a P-well body contact. In the conventional organization the body contact is placed nearby the source and drain regions of the transistor and is separated by body epitaxy at the surface without the use of a thick field oxide. If that conventional method were applied to an SOI structure, the P-well (or body) region would have to be extended outward from the channel (directly below the gate 3' in epitaxy 9') in either of the two available orthogonal directions parallel to the surface of the wafer 15 If this were done, then the P-well epitaxy o would also have to extend some additional area underneath the polysilicon gate 3' when compared with the preferred embodiment of FIG. 8. This conventional organization would cause an increase in transistor input capacitance without a corresponding increase in transconductance, thereby resulting in a reduced bandwidth for the gain of the transistor in most circuit configurations. This organization would also result in the formation of one or two inside corners to the sidewall oxides 4', such that the junction boundary of the N type lightly-doped-drain 14' would become a function of (mask alignment of gate 3' to oxides 4', resulting in widely varying capacitances of the NMOS transistor's drain to the P-well (or body) 9' and P+ sidewall layers 10' as a result of such fabrication.

Collectively, this new NMOS transistor structure causes the following electrical and physical improvements to be realized:

(1) Two of the four lateral sides (i.e, the sides parallel to IX—IX of FIG. 8) of the overall N-drain region 1' and 14' meet the thick field oxides in region 4'. Also, the bottom of the deep LDD region meets the buried oxide region 11'. This results in the formation of very low coupling capacitances through the thick oxides to other neighboring structures and the bottom substrate region 12'. The P+ layer 10' is converted to N+ at the oxides interfaces on a minimum of the two lateral sides (parallel to IX—IX), as well as the bottom, as shown in FIG. 8. If this is done, then it is not necessary that the third lateral side (at the end of the drain region 1') be converted to N+ at the oxide, as the remaining P+ and P type well regions (as shown) act to form a larger capacitance coupling the N type drain regions which is in series with the smaller capacitance already formed and electrically isolated by the thick lateral oxide regions 4' to other devices on integrated circuit 15' (not shown). As a result, this structure effectively reduces drain coupling capacitances, dominated by the N+ to P+ junctions required to prevent high leakage currents, through the reduction of the net area of these junctions when compared to an NMOS transistor of equal surface dimensions produced with a conventional NMOS technology (See FIGS. 1-6 and the discussion of the prior art).

(2) As a result of the use of extended lightly doped drain region in combination with an insulating buried oxide layer 11', the adverse effect of hot-electron induced injection of minority carriers, otherwise collected in the substrate region in conventional NMOS transistor structure, is greatly reduced. This is an important consideration in the fabrication of small short-channel transistors for application in very large scale integrated (VLSI) circuits, in which case, the electric fields in the surface region of the channel (directly below the gate 3') are typically high ($\sim 10^5$ volts/cm) and non-uniform, particularly on the drain side of the channel. This hot-electron induced collection by the substrate in conventional VLSI results in large currents in the substrate which are difficult to control in fabrication or by circuit design. These substrate currents result in higher static power dissipation or latch-up both of which are eliminated by this invention.

(3) The physical organization of the NMOS transistor's N+ source 2', N+ drain 1' and deep LDD 14', and P-well (or body) 9' regions, in accordance with FIGS. 7-12 minimizes the area required to fabricate an NMOS transistor as a result of making contiguous the P-well (body) region 9' below the source 2' to a place where a silicide contact 8' is used to make contact (to circuit ground potential) simultaneously to the N+ source 2' and the P-well 9'. This is an important improvement where the use of sidewall and buried oxides results in limited access to the transistor's channel region (directly below the gate 3'). As a result, a separate dedicated contact for the P-well (or body) region 9' is not required, which would otherwise increase the area required to produce an NMOS transistor as in prior art implementations which use sidewall oxides (such as LOCOS).

EXAMPLE

An integrated circuit has been developed, by computer simulation, following the principles outlined above for the preferred embodiment. This example is taken from a high-speed static random access memory designed to have 262,144 bits of storage capacity. This design utilizes a six-transistor cell, which includes the use of PMOS transistors in the calculations. It is understood that the invention can be applied to other types of memory designs (one, two and four transistor cell designs), as well as other circuits in which a plurality of NMOS transistor drain regions are electrically connected together. The values discussed below are not critical to the success of the present invention, they being variable for the development of other types of integrated circuits, as well.

Tables 1-6 below record the actual calculated design parameters o an NMOS transistor which has been employed in a computer simulated memory design where 512 of these transistor's drains are electrically connected together by a conductive interconnect "bit line" used to perform electronic read/write operations to/from each memory cell. Listed are the preferred embodiment device parameters which were used in sizing, junction depths, oxide thicknesses, operating conditions, and capacitance-related information defining the drain region of each transistor. Parameters are numbered from 1-51. Some entries are listed as "N/A" for not applicable for each case.

TABLE 1

NMOS Transistor Lateral Feature Sizes
(Preferred Embodiment Example)

| | | |
|---|---|---|
| 1. NMOS Transistor N+ Drain Length | 1.6 | μm |
| 2. NMOS Transistor N+ Drain Width | 1.0 | μm |
| 3. NMOS Transistor N+ Source Length | 1.6 | μm |
| 4. NMOS Transistor N+ Source Width | 1.0 | μm |
| 5. NMOS Transistor N+ Polysilicon Gate Length | 1.0 | μm |
| 6. N+ Polysilicon Oxide Spacer Width | 0.10 | μm |
| 7. P+ Isolation Sidewall Out-Diffusion Into N+ Drain | 0.00 | μm |
| 8. P+ Isolation Out-Diff along Bottom/Sides of N+ Drain | 0.15 | μm |

TABLE 2

NMOS Transistor Junction Depths
(Preferred Embodiment Example)

| | | |
|---|---|---|
| 9. N+ Source/Drain Diffusion Depth | 0.18 | μm |
| 10. N+ Lightly-Doped Drain Depth Into Channel | 0.10 | μm |
| 11. N+ Lightly-Doped Drain Depth Below N+ Drain* | 0.45 | μm |
| 12. N+ Lightly-Doped Drain Depth Below N+ Source | 0.22 | μm |
| 13. P.Well Region Epitaxy Thickness Over Buried Oxide | 0.35 | μm |
| 14. P+ Isolation Up Diffusion Into N+ From Buried Oxide | 0.05 | μm |
| 15. Gate Oxide Thickness | 20 | μm |
| 16. Sidewall Isolation Oxide Average Width | 1.0 | μm |
| 17. Buried Oxide Thickness to Substrate | 2.0 | μm |
| 18. P+ Channel Implant Depth | 0.10 | μm |

*Design depth if no buried layer was present.

TABLE 3

NMOS Transistor Doping Concentrations
(Preferred Embodiment Example)

| | | |
|---|---|---|
| 19. N+ Source/Drain Surface Concentration | $1.2 \times 10^{20}$ | atoms/cm3 |
| 20. N+ Source/Drain Avg. Sidewall Concentration | $8.0 \times 10^{19}$ | atoms/cm3 |
| 21. N+ Source/Drain Bottom Concentration | $5.0 \times 10^{19}$ | atoms/cm3 |
| 22. LDD Sidewall Avg. Concentration Source/Drain | $1.0 \times 10^{18}$ | atoms/cm3 |
| 23. LDD Bottom Concentration, Drain Only | $1.0 \times 10^{18}$ | atoms/cm3 |
| 24. LDD Bottom Concentration, Source Only | $1.0 \times 10^{18}$ | atoms/cm3 |
| 25. P+ Isolation Sidewall & UP-Diff Concentration at Oxide Interface | $3.0 \times 10^{18}$ | atoms/cm3 |
| 26. P+ Channel Implant Surface Concentration | $3.0 \times 10^{17}$ | atoms/cm3 |
| 27. P-Well Epitaxy Concentration | $5.0 \times 10^{18}$ | atoms/cm3 |

TABLE 4

NMOS Transistor Operating Parameters
(Preferred Embodiment Example)

| | | |
|---|---|---|
| 28. Device Temperature | 27.0 | °C. |
| 29. Device Drain to Source Bias Voltage | 1.45 | volts |
| 30. Device Gate to Source Bias Voltage | 5.00 | volts |
| 31. Device Threshold Voltage Vt | 0.75 | volts |
| 32. Device Effective Channel Length | 0.82 | $\mu$m |
| 33. Device Drain to Source Current: | 349 | $\mu$A |

TABLE 5

NMOS Transistor Drain Capacitances/Area
(Preferred Embodiment Example)

| | | |
|---|---|---|
| 34. N+ Drain Bottom to P-Well Body | N/A | ff/$\mu$m2 |
| 35. N+ Drain Sidewall to P+ Channel Implant | 0.930 | ff/$\mu$m2 |
| 36. N+ Drain Sidewall to P-Well Body | 0.426 | ff/$\mu$m2 |
| 37. N+ Drain Sidewall to P+ Isolation Sidewall | N/A | ff/$\mu$m2 |
| 38. N+ Drain Bottom to P+ Isolation Sidewall | N/A | ff/$\mu$m2 |
| 39. N+ Drain Region Bottom & Side Edges to P+ Isolation | 1.656 | ff/$\mu$m2 |
| 40. N+ Drain Region to Sidewall Oxide | 0.035 | ff/$\mu$m2 |
| 41. N+ Drain Region to Bottom Oxide | 0.017 | ff/$\mu$m2 |
| 42. N+ Drain Region to Polysilicon Gate | 1.727 | ff/$\mu$m2 |

TABLE 6

Areas for NMOS Transistor Drain Region
(Preferred Embodiment Example)

| | | |
|---|---|---|
| 43. N+ Drain Bottom to P-Well Body | N/A | $\mu$m2 |
| 44. N+ Drain Sidewall to P+ Channel Implant | 0.10 | $\mu$m2 |
| 45. N+ Drain Sidewall to P-Well Body | 0.30 | $\mu$m2 |
| 46. N+ Drain Sidewall to P+ Isolation Sidewall | N/A | $\mu$m2 |
| 47. N+ Drain Bottom to P+ Isolation Sidewall | N/A | $\mu$m2 |
| 48. N+ Drain Region Bottom & Side Edges to P+ Isolation | 0.17 | $\mu$m2 |
| 49. N+ Drain Region to Sidewall Oxide | 1.47 | $\mu$m2 |
| 50. N+ Drain Region to Bottom Oxide | 1.60 | $\mu$m2 |
| 51. N+ Drain Region to Polysilicon Gate | 0.09 | $\mu$m2 |

The NMOS transistor drain capacitance, resulting from taking the sum of the products for the capacitances per unit area listed in Table 5 and their respective drain areas listed in Table 6, above, is 0.7364 femtofarads (ff). This is the overall parasitic capacitance of the drain to the wafer substrate and neighboring devices, and this calculation does not include the capacitances of conductive interconnects to the drain.

Tables 7-12 below summarize a similar prior art NMOS transistor, where changes in device parameters pertinent only to the methodology of this invention are listed. These changes pertain to differences regarding the formation of a deep N+ lightly doped drain region which is selectively patterned around the N+ drain region only. As a result, the benefits of capacitance reduction by having the drain region border on a buried oxide layer in the wafer substrate no longer exist. Many of these changes are summarized below. Note, also, that to make a more valid comparison, the computer calculations assume that the prior art device shown in FIG. 1 has been modified, in accordance with the invention, to utilize a silicide strap terminal 8', as shown in FIG. 7.

TABLE 7

NMOS Transistor Lateral Feature Sizes
(Prior Art Example)

Parameters 1-6, and 8 are identical in this example to those listed in Table 1. The difference in this example for the prior art is:

| | | |
|---|---|---|
| 7. P+ Isolation Sidewall Out-Diffusion Into N+ Drain | 0.05 | $\mu$m |

TABLE 8

NMOS Transistor Junction Depths
(Prior Art Example)

Parameters 9, 10, 12, 15, 16 and 18 are identical in this example to those listed in Table

| | | |
|---|---|---|
| 11. N+ Lightly-Doped Drain Depth Below N+ Drain | 0.22 | $\mu$m |
| 13. P-Well Region Epitaxy Thickness Over Buried Oxide | 1.00 | $\mu$m |
| 14. P+ Isolation Up Diffusion Into N+ From Buried Oxide | N/A | $\mu$m |
| 17. Buried Oxide Thickness to Substrate | N/A | $\mu$m |

TABLE 9

NMOS Transistor Doping Concentrations
(Prior Art Example)

Parameters 19-27 are identical in this example to those listed in Table 3.

TABLE 10

NMOS Transistor Operating Parameters
(Prior Art Example)

Parameters 28-33 are identical in this example to those listed in Table 4.

TABLE 11

NMOS Transistor Drain Capacitances/Area
(Prior Art Example)

| | | |
|---|---|---|
| 34. N+ Drain Bottom to P-Well Body | 0.420 | ff/$\mu$m2 |
| 35. N+ Drain Sidewall to P+ Channel Implant | 0.930 | ff/$\mu$m2 |
| 36. N+ Drain Sidewall to P.Well Body | 0.426 | ff/$\mu$m2 |
| 37. N+ Drain Sidewall to P+ Isolation Sidewall | 3.157 | ff/$\mu$m2 |
| 38. N+ Drain Bottom to P+ Isolation Sidewall | 3.157 | ff/$\mu$m2 |
| 39. N+ Drain Region Bottom & Side | N/A | ff/$\mu$m2 |

TABLE 11-continued

NMOS Transistor Drain Capacitances/Area
(Prior Art Example)

| | Edges to P+ | Isolation |
|---|---|---|
| 40. | N+ Drain Region to Sidewall Oxide | N/A ff/μm2 |
| 41. | N+ Drain Region to Bottom Oxide | N/A ff/μm2 |
| 42. | N+ Drain Region to Polysilicon Gate | 1.727 ff/μm2 |

TABLE 12

Areas for NMOS Transistor Drain Region
(Prior Art Example)

| 43. | N+ Drain Bottom to P-Well Body | 1.39 | μm2 |
|---|---|---|---|
| 44. | N+ Drain Sidewall to P+ Channel Implant | 0.09 | μm2 |
| 45. | N+ Drain Sidewall to P-Well Body | 0.45 | μm2 |
| 46. | N+ Drain Sidewall to P+ Isolation Sidewall | 0.73 | μm2 |
| 47. | N+ Drain Bottom to P+ Isolation Sidewall | 0.41 | μm2 |
| 48. | N+ Drain Region Bottom & Side Edges to P+ Isolation | N/A | μm2 |
| 49. | N+ Drain Region to Sidewall Oxide | N/A | μm2 |
| 50. | N+ Drain Region to Bottom Oxide | N/A | μm2 |
| 51. | N+ Drain Region to Polysilicon Gate | 0.09 | μm2 |

The total NMOS transistor drain region capacitance, resulting from the sum of the products from Tables 11 and 12, above, is 4,623 femto-farads. This capacitance is 6.27 times higher than that derived from the example for the preferred embodiment.

In summary, the implementation of this method in this example shows that by providing for a deep N+ lightly doped drain (parameters nos. 11 and 13), as well as causing a complete inversion of the P-well to N+ border along the two lateral sides of the N+ drain to the sidewall and buried oxides (so that the drain end is either fully inverted or electrically isolated from the P-well body (controlled by parameters no 11 and 13 Specifically, 11 must be designed to be deeper than 13), the elimination of certain capacitance terms by this invention is achieved (parameters nos 34, 37, 38 and 43, 46, 47). While other capacitance terms (parameters nos. 39, 40, 41 and 48, 49, 50) not found in the prior art are included their values do not outweigh the excluded terms. It is clear that the merits of this invention, which cause the elimination of selected high-value capacitance terms and the inclusion o other lower-value capacitance terms, result in a much lower overall capacitance of the drain region to the substrate, body, and neighboring devices on a common wafer.

The preferred embodiment NMOS transistor has been applied by computer simulation in the manufacture of a 256K-bit static random access memory SRAM integrated circuit using silicon-on-insulator (SOI) wafer substrates. In this case, a six-transistor memory cell design was used, where each of the four NMOS transistors in each memory cell were manufactured in accordance with the preferred embodiment. Also, 512 of these cells were connected together along the direction of the bit access lines Predicted bit-line response time of 1.87 nano-seconds was shown. This compares favorably with the bit-line response times ranging between 5 and 15 nano-seconds which have been reported for other prior art SRAM designs which utilized similar device feature sizes, junction depths and doping concentrations when compared to the preferred embodiment.

EQUIVALENTS

Those skilled in the art will recognize, or be able to ascertain, employing no more than routine experimentation, many equivalents to the specific structures, steps, functions and materials described specifically herein, and such equivalents are intended to be encompassed within the scope of the following claims. For example, while the LDD region in the example has a doping level of $1 \times 10^{18}$ atoms/cm$^3$, the term "lightly doped" is intended to cover a dopant level sufficient to cause inversion of the P type body in the region where the LDD is desired, but not higher than the shallow N+ surface drain region. Keeping the dopant level of the LDD region below that of the surface drain region permits the electric fields to spread out over a larger region. A preferred range of dopant level for the LLD region is about $1 \times 10^{17}$ to $10^{19}$ atoms/cm$^3$, while the N+ surface drain region should preferably be less than about $10^{19}$ atoms/cm$^3$.

Other methods of active area isolation are contemplated, such as the so-called SIMOX process, which uses oxygen ion bombardment. Silicon on Sapphire (SOS) structures may be used in place of SOI wafers. Wafer bonding and DI wafers are also contemplated.

What is claimed is:

1. In a metal-oxide semiconductor transistor having a drain region, and a source region formed in a crystalline semiconductor body layer provided over a planar surface of a semiconductor substrate wafer, and a gate electrode with a gate oxide beneath said gate electrode, the improvement comprising:
   (a) a buried insulator layer formed on the semiconductor body between said crystalline semiconductor body layer and said substrate and covering said planar surface;
   (b) said drain region comprising an upper drain region and a lower lightly doped region extending to said insulator layer and the dopant level of the lower region being less than that of the upper region and which is sufficient to cause conversion of the semiconductor body layer in the lower region; and
   (c) said source region not extending to said insulator.

2. The semiconductor transistor of claim 1 wherein the drain and source regions are doped as N type, the semiconductor body layer is doped as P type, and the lightly doped device region is N-doped, and a field oxide is formed in the semiconductor body layer and extends to said insulator layer to laterally isolate the transistor from other devices formed in the semiconductor body layer.

3. In a metal-oxide semiconductor transistor having a drain region, and a source region formed in a crystalline semiconductor body layer provided over a semiconductor substrate wafer, and a gate electrode with a gate oxide beneath said gate electrode, the improvement comprising:
   (a) an insulator layer between said crystalline semiconductor body layer and said substrate;
   (b) said drain region including a lightly doped region extending to said insulator layer; and
   (c) said source region not extending to said insulator; and wherein the drain and source regions are doped as N type, the semiconductor body layer is doped as P type, and the lightly doped drain region is N-doped, and a field oxide is formed in the semiconductor body layer and extends to said insulator layer to laterally isolate the transistor from other devices formed in the semiconductor body layer; and wherein the field oxide is P+ doped and forms P+ sidewalls at the interface between the field oxide and the semiconductor body layer to form a low leakage PN junction at said interface.

4. The semiconductor transistor of claim 3 wherein the semiconductor body layer extends contiguous from a channel region beneath the gate electrode and continues beneath the source region and further including a body contact electrode located laterally adjacent said source region for electrically contacting said body layer as it extends beneath the source region.

5. The semiconductor transistor of claim 4 wherein said contact electrode is formed of a metal silicide.

6. The semiconductor transistor of claim 3 wherein the drain region is coupled by a metal-silicide strap to a polysilicon strip.

7. The semiconductor transistor of claim 3 wherein the doping concentration of the lightly doped region is in the range of $1 \times 10^{17}$ to $10^{19}$ atoms/cm$^3$.

8. The semiconductor transistor of claim 3 wherein the body layer and wafer is formed of silicon, the gate electrode of polysilicon and the insulator layer of silicon oxide.

9. A semiconductor transistor formed on a semiconductor wafer comprising:
 (a) an insulator layer on said wafer;
 (b) an epitaxial body layer on said insulator layer;
 (c) doped surface source and drain regions of same type conductivity formed in said body layer laterally adjacent and displaced from one another;
 (d) a thin insulator region formed over said body layer in the space between the source and drain regions;
 (e) a gate electrode formed on said thin insulator region;
 (f) a thick field oxide region formed in said body layer laterally encircling said transistor and extending vertically to said insulator layer;
 (g) a lightly doped subsurface drain region extending from said surface drain region to said insulator layer, the dopant level of this lightly doped region being lower than that of the surface drain region and being sufficient to cause conversion of said body layer in the vicinity of said drain region; and said source region being shallow in depth, so as to not extend to said insulator region.

10. In a metal-oxide semiconductor transistor having a doped drain region and a source region of same type conductivity formed in a crystalline semiconductor body layer of opposite conductivity provided over a semiconductor substrate wafer and a gate electrode with a gate oxide beneath the gate electrode, the improvement comprising:
 (a) a doped buried insulator layer formed between said body layer and said wafer;
 (b) a lightly doped deep extended region of same conductivity as said drain region selectively formed beneath said drain region and extending to said insulator layer and having a dopant level less than the level of said drain and sufficient to cause dopant conversion of the body layer;
 (c) a thick field oxide region laterally encircling said transistor and extending to said insulator layer;
 (d) said source region being a shallow region which terminates in said body layer and does not extend to said insulator layer.

11. The transistor of claim 10 wherein the insulator layer is formed of material from the group consisting of silicon oxide or silicon nitride, the gate electrode is formed of polysilicon, the drain and source regions of N type silicon, and the body layer of P type silicon.

12. A semiconductor transistor formed on a semiconductor wafer comprising:
 (a) an insulator layer on said wafer;
 (b) an epitaxial body layer on said insulator layer;
 (c) surface source and drain regions of same type conductivity formed in said body layer laterally adjacent and displaced from one another;
 (d) a thin insulator region formed over said body layer in the space between the source and drain regions;
 (e) a gate electrode formed on said thin insulator region;
 (f) a thick field oxide region formed in said body layer laterally encircling said transistor and extending vertically to said insulator layer;
 (g) a lightly doped subsurface drain region extending from said surface drain region to said insulator layer; and said source region being shallow in depth, so as to not extend to said insulator region; and wherein the conductivity of the source and drain regions is N type and the conductivity of the body layer is P type and thin P type sidewalls are formed at the interface between the field oxide region and the semiconductor body layer and a thin P type oxide layer is formed beneath said body layer and over said insulator layer opposite the source region.

* * * * *